(12) United States Patent
Sridhara et al.

(10) Patent No.: US 10,382,065 B1
(45) Date of Patent: Aug. 13, 2019

(54) ITERATIVE OUTER CODE RECOVERY USING DATA FROM MULTIPLE READS

(71) Applicant: Seagate Technology LLC, Cupertino, CA (US)

(72) Inventors: Deepak Sridhara, Longmont, CO (US); Ara Patapoutian, Hopkinton, MA (US); Prafulla B Reddy, Longmont, CO (US); Jason Charles Jury, Minneapolis, MN (US); Richard Jay Parshall, Shrewsbury, MA (US)

(73) Assignee: Seagate Technology LLC, Cupertino, CA (US)

( * ) Notice: Subject to any disclaimer, the term of this patent is extended or adjusted under 35 U.S.C. 154(b) by 257 days.

(21) Appl. No.: 15/345,437

(22) Filed: Nov. 7, 2016

(51) Int. Cl.
| H03M 13/29 | (2006.01) |
| G06F 3/06 | (2006.01) |
| G06F 11/10 | (2006.01) |
| H03M 13/11 | (2006.01) |
| H03M 13/15 | (2006.01) |
| H03M 13/00 | (2006.01) |

(52) U.S. Cl.
CPC ........ *H03M 13/2948* (2013.01); *G06F 3/064* (2013.01); *G06F 3/0619* (2013.01); *G06F 3/0655* (2013.01); *G06F 3/0674* (2013.01); *G06F 11/1076* (2013.01); *H03M 13/1102* (2013.01); *H03M 13/1515* (2013.01); *H03M 13/6502* (2013.01)

(58) Field of Classification Search
CPC ...... G06F 3/0619; G06F 3/064; G06F 3/0655; G06F 3/0674; G06F 11/1076; H03M 13/2948; H03M 13/1102; H03M 13/1515; H03M 13/6502
See application file for complete search history.

(56) References Cited

U.S. PATENT DOCUMENTS

| 5,991,911 | A  | * | 11/1999 | Zook | G11B 20/1833 714/755 |
| 6,772,384 | B1 | * | 8/2004 | Noguchi | G11B 20/1833 714/755 |
| 7,356,753 | B2 | * | 4/2008 | Chen | G11B 20/18 714/755 |
| 8,570,679 | B2 |   | 10/2013 | Wu et al. | |
| 8,760,986 | B2 |   | 6/2014 | Reddy et al. | |
| 8,910,026 | B2 |   | 12/2014 | Patapoutian et al. | |
| 8,976,476 | B1 |   | 3/2015 | Lu et al. | |
| 2007/0150798 | A1 | * | 6/2007 | Shieh | G11B 20/1833 714/785 |
| 2012/0278679 | A1 |   | 11/2012 | Rub et al. | |
| 2013/0275829 | A1 |   | 10/2013 | Sridhara | |
| 2014/0172934 | A1 |   | 6/2014 | Yang et al. | |

* cited by examiner

*Primary Examiner* — Phung M Chung
(74) *Attorney, Agent, or Firm* — Cesari & Reed LLP; Kirk A. Cesari

(57) ABSTRACT

An apparatus may include a circuit that initializes a read operation to read one or more requested data segments of a respective data unit. The circuit may generate equalized combined samples for a failed data segment of the one or more requested data segments based on first samples and second samples. In addition, the circuit may perform iterative outer code recovery for the data unit utilizing the equalized combined samples as samples for the failed data segment.

20 Claims, 17 Drawing Sheets

ITERATIVE OUTER CODE RECOVERY USING DATA FROM MULTIPLE READS

SUMMARY

An apparatus may include a circuit that initializes a read operation to read one or more requested data segments of a respective data unit. The circuit may generate equalized combined samples for a failed data segment of the one or more requested data segments based on first samples and second samples. In addition, the circuit may perform iterative outer code recovery for the data unit utilizing the equalized combined samples as samples for the failed data segment.

An apparatus may include a circuit configured to initialize a read operation to read one or more requested data segments of a respective data unit. The circuit may generate averaged samples for a failed data segment of the one or more requested data segments by averaging first samples of a first sampling of the failed data segment and second samples of a second sampling of the failed data segment. Further, the circuit may perform iterative outer code recovery for the data unit based at least in part on the averaged samples.

An apparatus may include a circuit configured to initialize a read operation to read one or more requested data segments of a respective data unit. The circuit may generate first samples for a failed data segment of the one or more requested data segments and generate second samples by reading one or more adjacent segments that are adjacent to the failed data segment, the one or more adjacent segments being of an adjacent data unit that is adjacent to the respective data unit of the failed data segment. Further, the circuit may determine a cancellation signal based on the second samples and generate equalized combined samples for the failed data segment based on the first samples and the second samples at least in part by applying the cancellation signal to the first samples. Moreover, the circuit may perform iterative outer code recovery for the data unit based at least in part on the equalized combined samples.

These and other features and benefits that characterize various embodiments of the disclosure can be understood in view of and upon reading the following detailed description and review of the associated drawings.

DETAILED DESCRIPTION

Figure 1:
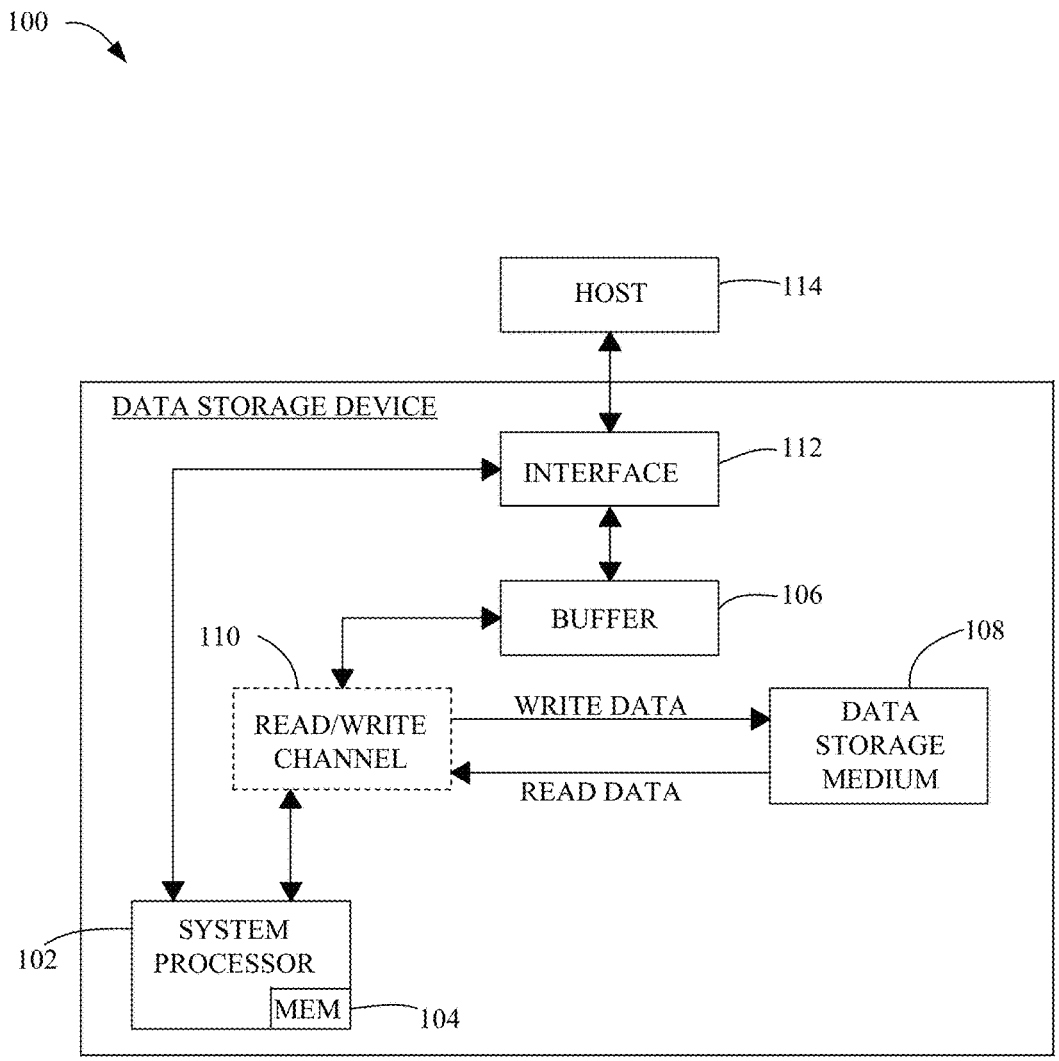
FIG. 1 is a simplified block diagram of an exemplary data storage device, in accordance with certain embodiments of the present disclosure.

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor or controller. In accordance with another embodiment, the methods and functions described herein may be implemented as one or more software programs running on a computing device, such as a personal computer that is using a disc drive. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or device including instructions that when executed cause a processor to perform the methods.

Embodiments of the disclosure may provide a method and apparatus for recovering data on a storage medium. When data is requested by a host from a storage device such as a hard drive, the requested data (e.g., incoming or read data) may be checked to ensure that it is error free. For example, a syndrome, such as an outer code syndrome, may be generated for a portion of requested data to indicate whether it contains errors. In some embodiments, the syndrome may be utilized to detect errors once the full data unit or outer code block is read. Requested data that contains errors (in other words, the requested data is not error free) may result in what may be referred to as a data failure (e.g., a segment/sector failure, a unit/track failure, etc.). Such requested failed data may then be decoded using various decoding techniques and/or the requested failed data may be attempted to be re-read from the storage medium. Some embodiments herein may relate to utilizing an iterative outer code recovery process using samples based on multiple reads (e.g. averaged samples, samples from adjacent tracks, etc.) to recover failed data.

For IOC recovery of a set of segments, the equalized samples from a channel may be sent to an inner decoder (e.g., a low density parity check (LDPC) decoder using LDPC codes) and the inner code may generates hard decisions (also referred to herein as hard data), which may form the decoding output. This hard data may be sent to the outer decoder and stored in memory. The outer decoder (e.g., a Reed Solomon (RS) decoder using RS code words) may use these hard decisions and may generate a new set of hard data that may be updated in memory and sent back to the inner decoder. The IOC recovery process may work iteratively, and may use the same samples that were used to generate the hard data in the first step during future iterations with the inner decoder. The starting point of IOC recovery may involve a read of the segment(s) to be recovered and the generating of equalized samples for these segments to be used in the IOC recovery process.

In some embodiments herein, improved samples may be generated using, for example, X-averaging, SERV or adjacent track interference cancellation (ATIC) and the improved samples may be used during the IOC recovery process. In some embodiments, SERV, X-averaging or ATIC may not able to recover the set of target segments but, using improved equalized samples generated during these attempts may significantly improve the success of IOC recovery. In some examples, the IOC recovery may utilize X-averaged (e.g. finite impulse response filter (FIR) samples resulting from analog digital converter (ADC) averaged samples) or SERV averaged (e.g. FIR averaged) samples already available in memory from an earlier recovery step. Moreover, the IOC recovery process may utilize a mix of types of samples for different failed segments. For example, the mix of types of samples may include the following non-limiting examples: SERV averaged samples, X-averaged samples, ATIC samples, and samples from a simple read. Any combination of these and other types of samples may be utilized for IOC recovery.

In examples utilizing ATIC improved samples in IOC recovery, the segments in the adjacent track(s) or data units that are adjacent to the failed segments are read and decoded. Prior to invoking ATIC recovery, the OC syndrome state of the outer code for the data unit of interest may be saved or protected. For example, the OC syndrome state may be transferred to memory. In some examples, the OC syndrome update function may be turned off (e.g., in hardware) when performing a read of the segments in the adjacent data unit. The segments adjacent to the failed segments may be read (e.g. a non-halting read operation may be used on the adjacent data unit to attempt to read the adjacent sectors in the same disk revolution). Further, some examples may transfer all recovered adjacent segment data to a location in memory for ATIC recovery.

Using overlapping boundary information for adjacent segments, a cancellation signal may be generated for each of the failed segments. The OC syndrome update function may be turned back on and/or the OC syndrome state for the current data unit may be restored. The cancellation signal may then be applied to the failed segment data. The composite signal that results may then be decoded. If previously failed segments are decoded successfully, the OC syndrome contribution of those segments may be updated in the OC syndrome. IOC recovery may then be utilized for the updated OC syndrome state that is available after some of the sectors have been recovered via ATIC recovery.

In general, a code may include rules for converting a piece of information into another representation (e.g., one symbol into another symbol). A code word may be an element of a code. Each code word may include a sequence of assembled symbols that may correspond with the rules of the code. For example, codes may be used in the error-correction of data. These types of codes, often described as channel codes, may contain redundancy that may provide for the communication of more reliable data, for example, in the presence of noise. One example error-correcting code is a concatenated code. Concatenated codes may be derived by using an inner code and an outer code.

Outer codes may improve the tolerance to defects, for example, by allowing one or more inner code failures. The size of a defect that can be corrected may be closely related to the code overhead (e.g., the outer code). Therefore, an outer code or longer code word may achieve the desired defect coverage with less relative overhead. Having an outer code that can recover inner code failures may also allow the inner code to be optimized for random error performance. LDPC (low density parity check) codes (which may generally be included in an inner code) may trade off performance to lower the error floor below the unrecoverable error rate. With an outer code as a safety mechanism, the error floor may be relaxed and LDPC codes may be optimized for performance.

Outer codes may be implemented by x-or'ing data across all inner code words. Such an implementation may provide the capability to recover from a single inner code word failure. In some such implementations, the signal-to-noise (SNR) gain for the overhead expended may be relatively small. In some implementation, outer codes may be derived based on Reed-Solomon codes. Such codes may allow for multiple inner code failures and may offer a significant SNR benefit for random errors. Furthermore, outer codes may "average out" the SNR variability. In sequential writing, many sources of variability may be removed. For example, degraded signals due to adjacent track interference (ATI) or adjacent track erasure (ATE) may be greatly diminished because repeated writes to adjacent or neighboring tracks may be eliminated. However, variability in regards to SNR, for example, due to transducer positioning, may occur. Outer codes (or very long code words) may exceed the time constants of the SNR variability and may offer the "averaged out" SNR variability.

FIG. 1 is a simplified block diagram of an exemplary data storage device 100 that can be used in embodiments described herein. Data storage device 100 includes a system processor 102, which is used for controlling certain operations of data storage device 100. The various operations of data storage device 100 are controlled by system processor 102 with the use of programming stored in memory 104, which may be, for example, a dynamic random access memory (DRAM), in some embodiments. System processor 102 may be coupled to a buffer 106 through an optional read/write channel 110. Buffer 106 can temporarily store user data during read and write operations and may include the capability of temporarily storing access operations pending execution by system processor 102.

System processor 102 may execute read and write operations on data storage medium 108. In one embodiment, system processor 102 may also be used for carrying out data recovery from data storage medium 108. In some embodiments, data storage medium 108 may be one or more magnetic discs. In other embodiments, data storage medium 108 can be a collection of solid-state memory elements. These read/write operations executed by system processor 102 may be performed directly on data storage medium 108 or through optional read/write channel 110. Read/write channel 110 may receive data from system processor 102 during a write operation, and may provide encoded write data to data storage medium 108. During a read operation, read/write channel 110 may process a read signal in order to detect and may decode data recorded on data storage medium. The decoded data may be provided to system processor 102 and ultimately through an interface 112 to an external host 114.

External host 114 may be a processor in an electronic device, such as a processor in a computing device. Although FIG. 1 illustrates external host 114 as being a single host, data storage device 100 may be connected through interface 112 to multiple hosts. Through interface 112, data storage device 100 may receive data and commands from external host 114 and may provide data and error codes to external host 114 based on commands executed by system processor 102.

Data storage medium 108 may include a plurality of data units. Each data unit may be subdivided into a plurality of storage segments. As defined herein, a storage segment may be the basic unit of data storage on data storage medium 108. The storage segments may be identified and located at various positions on medium 116.

Figure 2:
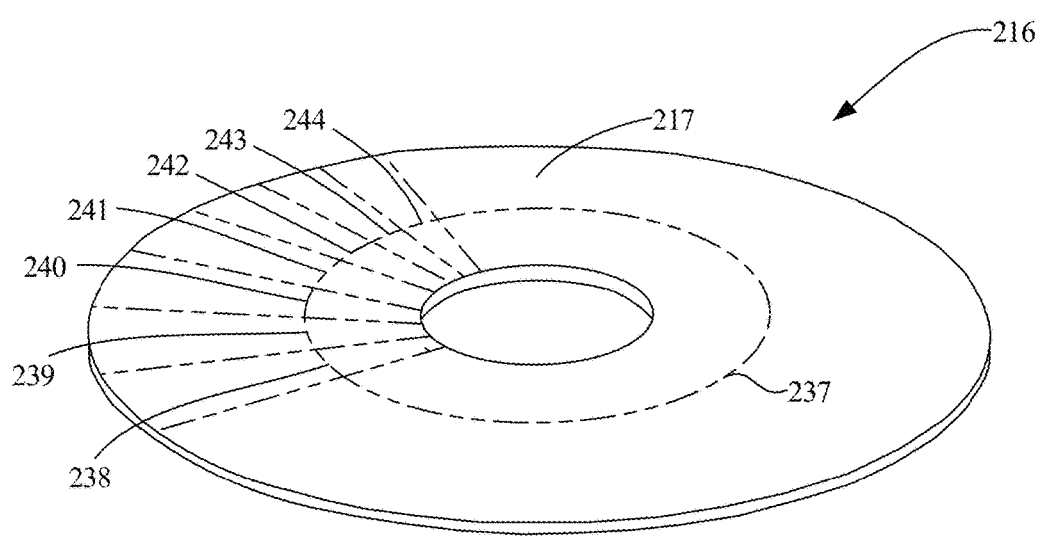
FIG. 2 illustrates an exemplary perspective view of a storage medium, in accordance with certain embodiments of the present disclosure.

As previously discussed, data storage medium 108 may include one or more magnetic discs. FIG. 2 illustrates such an exemplary disc storage medium 216. In FIG. 2, storage medium 216 may include a surface 217 having a plurality of substantially concentric circular tracks (e.g., data units), such as data track 237. In some embodiments, the data tracks on storage medium 216 may be logically divided into a plurality of data storage sectors (e.g., storage segments). Each storage sector may be identified and located at various positions on disc 216. In the disc-type medium example illustrated in FIG. 2, storage segments or data sectors may be "pie-shaped" angular sections of a track that are bounded on two sides by radii of the disc and on the other side by the perimeter of a circle that nay define the track. For example, data track 237 may be logically divided into data sectors 238-244.

Each track or data unit may have a related logical block addressing (LBA). For disc-type storage media, the LBA may include a cylinder address, head address and sector address. A cylinder may identify a set of specific tracks on the disc surface of each disc 116 which may lie at equal radii and may generally be simultaneously accessible by a collection of transducing heads in a data storage device. The head address may identify which head can read the data and therefore may identify which disc from the plurality of discs 216 the data is located on. As mentioned above, each track within a cylinder may be further divided into sectors for storing data. The data sector may be identified by an associated sector address.

With reference back to FIG. 1 and in embodiments described in more detail below, system processor 102 may implement a two-level parity encoding system to detect and correct data errors. These embodiments may organize data into two sets of groupings in which the first set of grouping may be encoded by an inner code and the second set of grouping may be encoded by an outer code.

Figure 3:
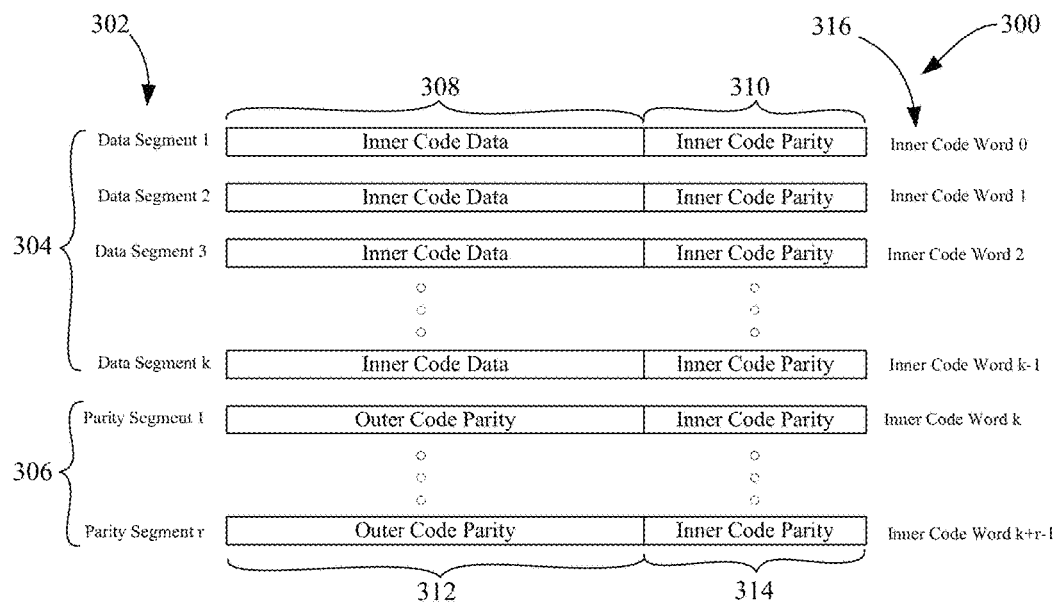
FIG. 3 illustrates a diagrammatic view of a data unit and its organized groupings of data into inner and outer codes, in accordance with certain embodiments of the present disclosure.

FIG. 3 illustrates a diagrammatic view of an embodiment of a data unit 300 and the organization of groupings of data into inner and outer codes. Data unit 300 may include a plurality of segments 302 for storing user data and/or parity data. The rows in FIG. 3 may represent a segment 302 in data unit 300 and may also represent one grouping in the first set of groupings being encoded by an inner code.

Segments 302 may be further divided into k number of segments 304 and r number of segments 306, wherein k and r may be integers greater than or equal to 1. Each of the k number of segments 304 may include a first portion 308, which may contain user data encoded by the inner code. Each of the k number of segments 304 may also include a second portion 310, which may contain inner code parity data encoded by an inner code. This inner code parity 310 may provide inner code protection against errors in the segment to which it belongs. More specifically, inner code parity 310 may provide protection against errors in the inner code data 308. Recovery using inner code parity may be referred to inner code recovery herein.

Each of the r number of segments 306 may include a first portion 312, which may contain parity data encoded by the outer code. Each of the r number of segments 306 may also include a second portion 314, which may contain inner code parity data encoded by the inner code. The outer code parity 312 may provide outer code protection against inner code failures, while the inner code parity 314 of r number of segments 306 may provide inner code protection against errors in the segment to which it belongs. More specifically, the inner code parity 314 may provide protection against errors in the outer code parity 312. Therefore, each row of segments may be considered to be an inner code word 316 starting with inner code word 0 and ending with inner code word k+r−1. Recovery of segments using outer code parity may be referred to herein as outer code recovery.

Any number of segments 306 (as represented by rows) may be provided for the outer code. The more segments that are provided for the outer code, the more errors that may be detected and may be corrected by the outer code parity 312. However, increasing the number of segments for the outer code and thereby increasing the number of parity data symbols, may come at the cost of reduced storage capacity of user data. As illustrated in FIG. 3 and for example, if the k number of segments is equal to 20 and the r number of segments is equal to 10, the outer code parity 312 may be capable of correcting a total of 10 errors in the 30 total segments which could be affected. It should be realized that errors may occur both in segments 304 as well as in segments 306.

In some embodiments, each of the plurality of segments 302 may be indicated by a row in FIG. 3 is associated with a logical block address (LBA). Each LBA may designate an address for the row of inner code data and inner code parity on a storage medium. In embodiments in which a magnetic disc provides the storage medium, the LBA can be the LBA of a data sector of a data track on the storage medium.

Figure 4:
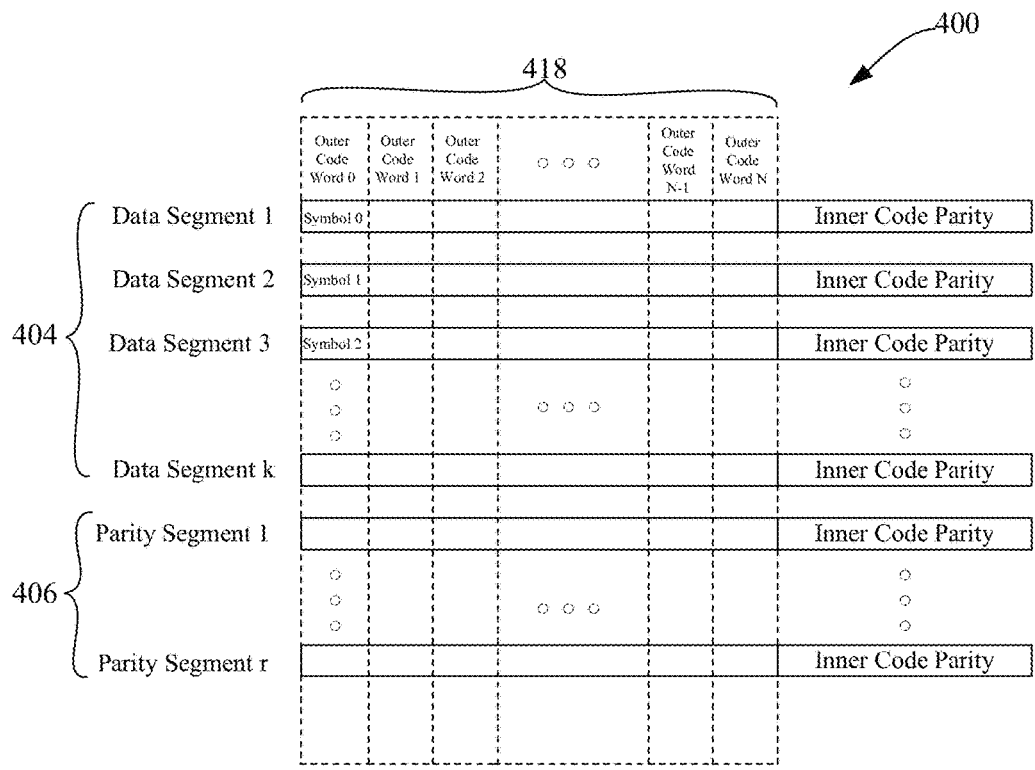
FIG. 4 illustrates a diagrammatic view of a data unit and its organized groupings of data into inner and outer codes based on a Reed-Solomon scheme, in accordance with certain embodiments of the present disclosure.

FIG. 4 illustrates a diagrammatic view of an embodiment of a data unit 400 and the organization of groupings of data into inner and outer codes based on a Reed-Solomon (RS) scheme. With a RS outer code, the unit of correction may be a symbol. A symbol may contain multiple bits of data. More specifically, the r number of segments 406 may be associated with the k number of segments 404 to derive a plurality of symbol-based outer code words 418. Each outer code word 418 may contain m number of symbols from each segment for correcting m number of symbols in each outer code word 418, wherein m is an integer greater than or equal to 1. For purposes of simplification, FIG. 4 may illustrate Reed-Solomon outer code words 418 having one symbol per segment (e.g., m=1).

Using the RS outer code illustrated in FIG. 4, it may be possible, in some instances, for more than the r number of inner code failures to be corrected. Even if inner code words are not recoverable, most of the bits of the inner code words may be correct. Similarly, symbols in outer code words that may be contained in failing inner code words may be mostly error-free and many outer code words can be corrected. More specifically, an outer code having r number of segments 406 can correct r number of inner code failures using erasures, where an erasure may be referred to as knowing the location of a symbol. However, the outer code can correct many outer code words 418 without using erasures.

Figure 5:
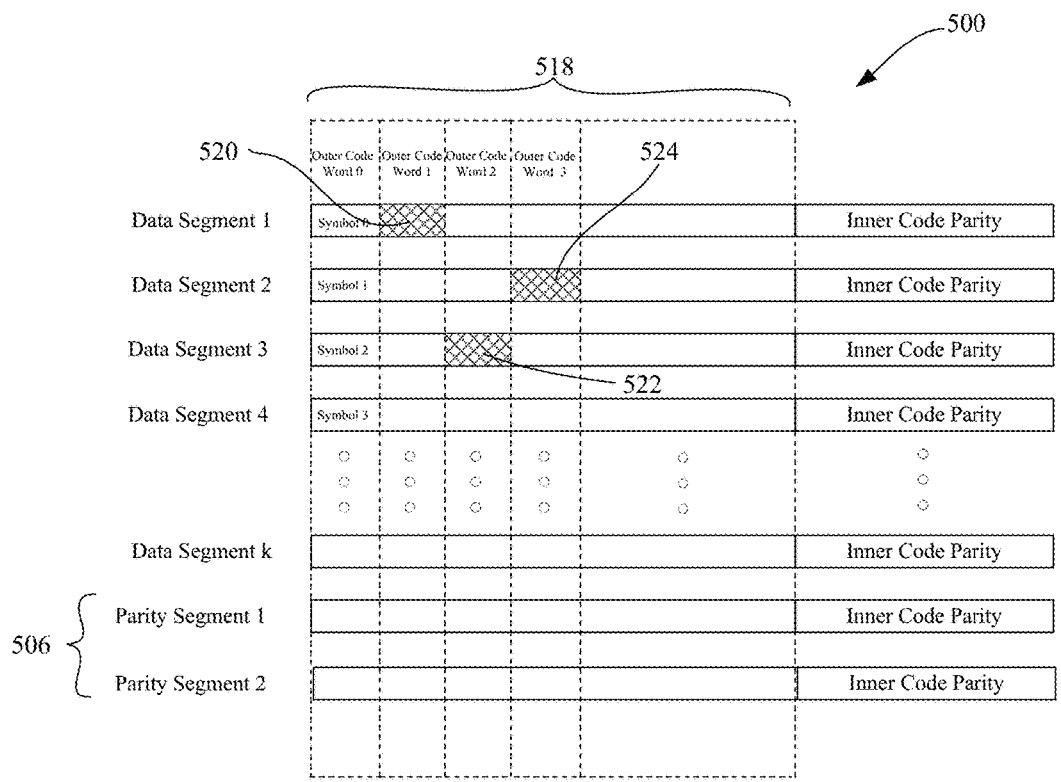
FIG. 5 illustrates a diagrammatic view of a data unit and its organized groupings of data into inner and outer codes based on a Reed-Solomon scheme, in accordance with certain embodiments of the present disclosure.

FIG. 5 illustrates a diagrammatic view of one embodiment of a data unit 500 and the organization of groupings of data into inner and outer codes based on a RS scheme. In FIG. 5, the r number of segments 506 is two (e.g., r=2). For simplicity and as illustrated in FIG. 4, each outer code word 518 may contain one symbol per segment (e.g., m=1). In addition, data unit 500 may include three symbol errors 520, 522 and 524 as illustrated in cross-hatch. These three symbol errors may be representative of errors that exceed the correction capability of the inner code.

Because data unit 500 includes three inner code failures and data unit 500 includes two parity segments, the RS outer code may not be sufficient to correct the three inner code failures using erasures. However, each outer code can correct one symbol in error in an outer code word 518 without erasures, and therefore the three errors shown can be corrected and the corresponding three inner code words can be recovered. It should be realized though that with higher bit error rates, the probability of having two or more symbol errors in the same outer code word in the configuration illustrated in FIG. 5 may be significant and may limit this functionality.

Figure 6:
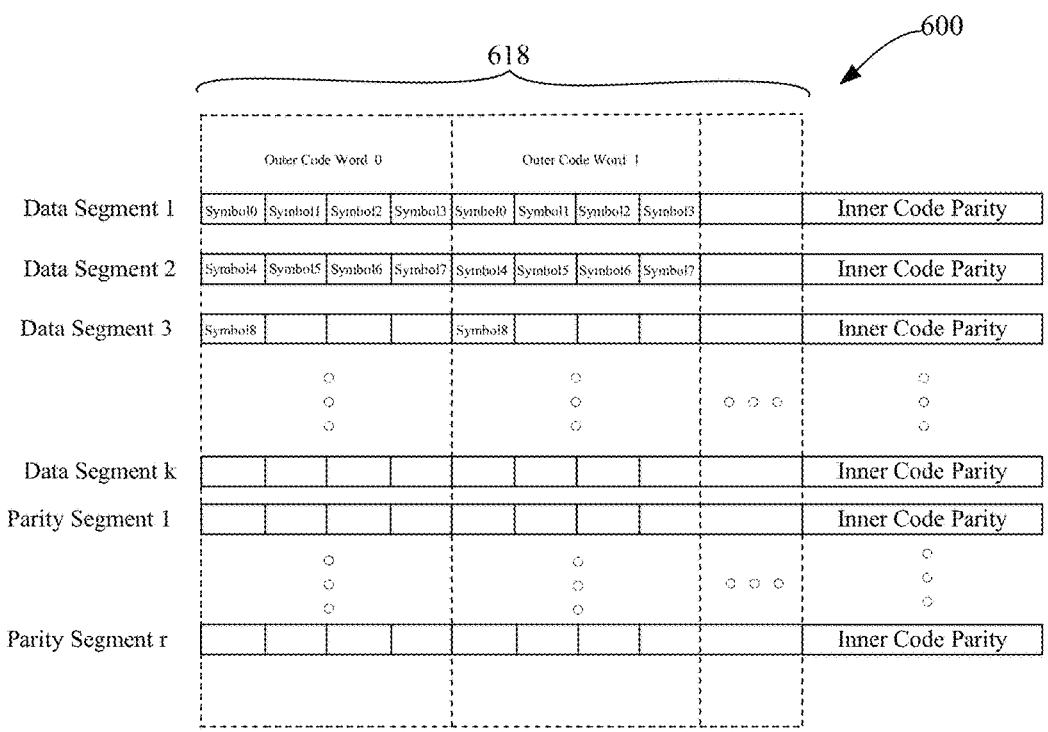
FIG. 6 illustrates a diagrammatic view of a data unit and its organized groupings of data into inner and outer codes based on a Reed-Solomon scheme, in accordance with certain embodiments of the present disclosure.

FIG. 6 illustrates a diagrammatic view of one embodiment of a data unit 600 and the organization of groups of data into inner and outer codes based on a RS scheme. As illustrated in FIG. 6, longer outer code words 618 may be used compared to the length of outer code words in FIG. 5. These longer outer code words 618 contain four symbols in each inner code word (e.g., m=4). In a system without erasures, more errors may be corrected using a longer outer code word than that of a short outer code word.

Figure 7:
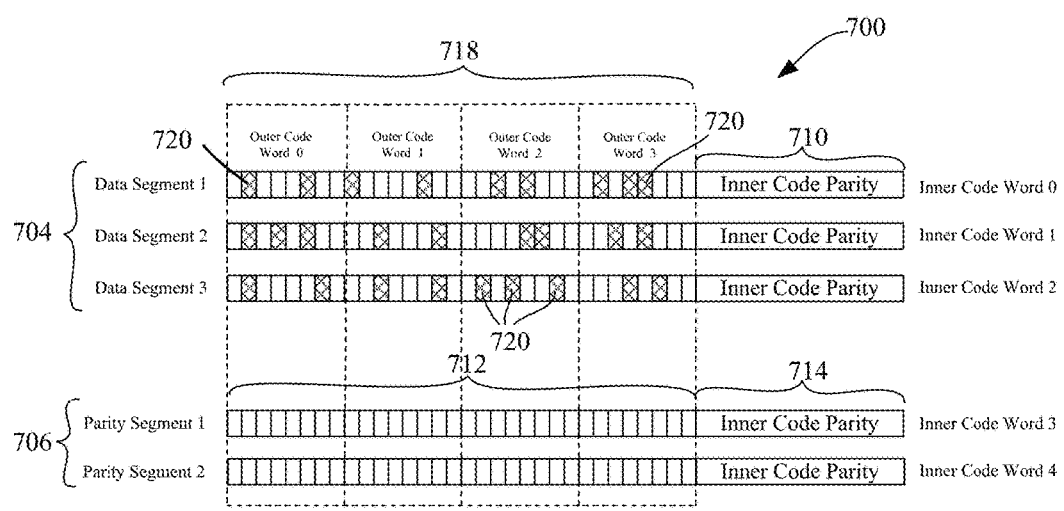
FIG. 7 illustrates a diagrammatic view of a data unit and its organized groupings of data into inner and outer codes based on a Reed-Solomon scheme, in accordance with certain embodiments of the present disclosure.

FIG. 7 illustrates a diagrammatic view of one embodiment of a data unit 700 and the organization of groups of data into inner code 710 and 714 and outer code 712 based on a RS scheme. In FIG. 7, each outer code word 718 may include longer outer code words. In particular, each outer code word 718 may include eight symbols (e.g., m=8) per segment 704 and 706. With two r segments (e.g., r=2) and each outer code word including eight symbols per r segment 706, sixteen symbols of parity in each outer code word 718 can correct eight symbol errors (not correctable by the inner code) without erasure. Therefore, in the embodiment illustrated in FIG. 7, all of the outer code words 718 may be correctable since each outer code word 718 has at most eight symbol errors 720 as represented in cross-hatch. Although no symbol errors exist in segments 706, for purposes of simplification, it should be realized that segments 706 can also include symbol errors which may also have to be corrected in order to utilize outer code 712.

If, on the other hand, any of the outer code words 718 had more than eight symbol errors 720, then the outer code 712 illustrated in FIG. 7 may not be usable to recover all of the errors that could not be corrected by the inner code. Any outer code words 718 that include a number of symbol errors that exceeds the correction capability of the outer code may not be correctable and therefore may not be recoverable. However, in some embodiments, the capability of the outer code to correct inner code failures can be further extended. In particular, the capability of the outer code to correct more symbol errors can be extended by iterating between the inner and the outer codes. The corrected data from the outer code words that may be correctable may be usable to recover some of the inner code words that had original failed. Correcting only a fraction of the bits in error at a time can be sufficient to gradually reduce the number of errors by repeated iterations until all the errors are corrected. In the other words, some of the outer code words may be corrected in the first iteration, compared to correcting all of the outer code words.

Figure 8:
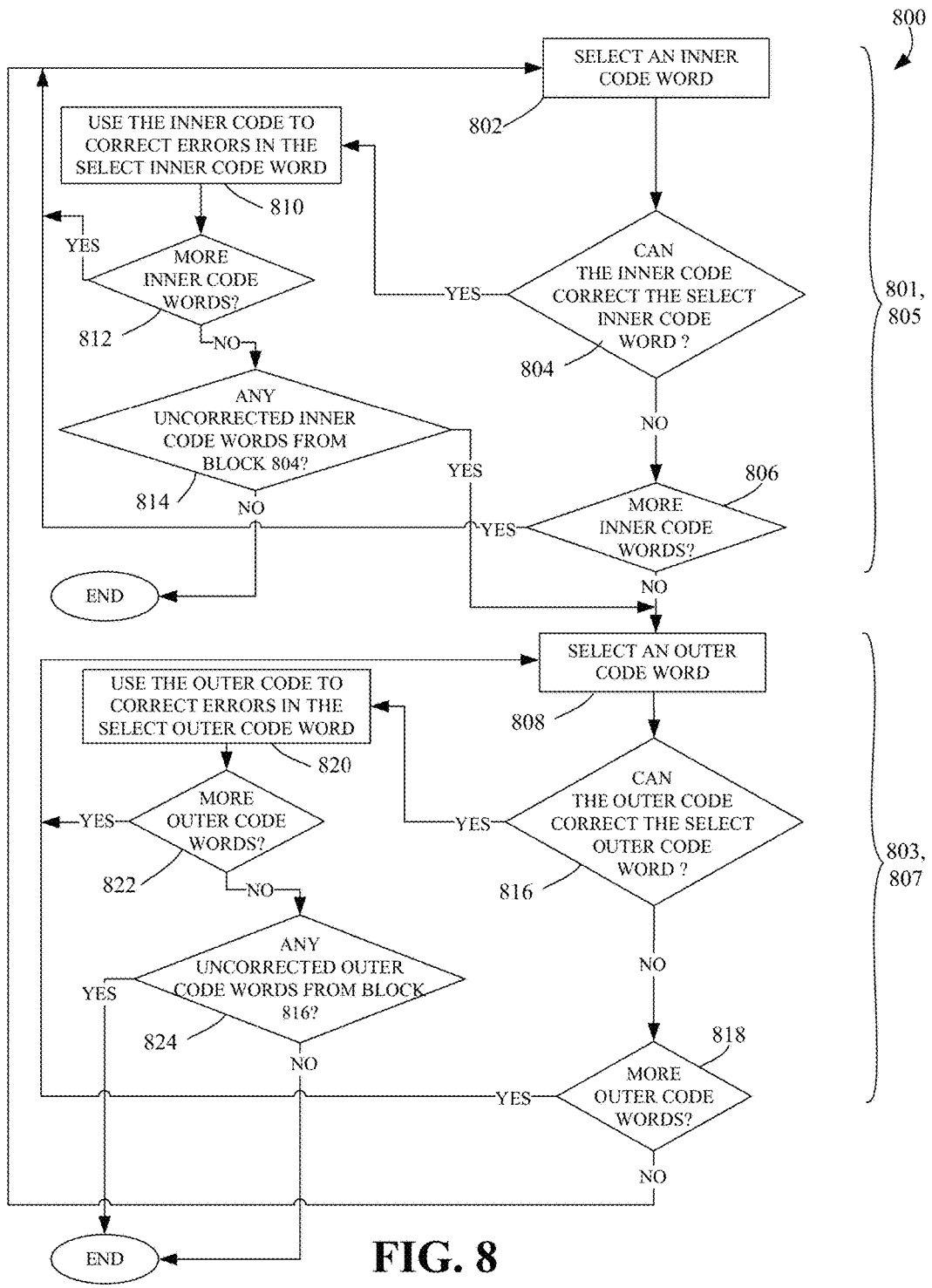
FIG. 8 is a flowchart illustrating a method of recovering data using inner and outer codes, in accordance with certain embodiments of the present disclosure.
Figure 9:
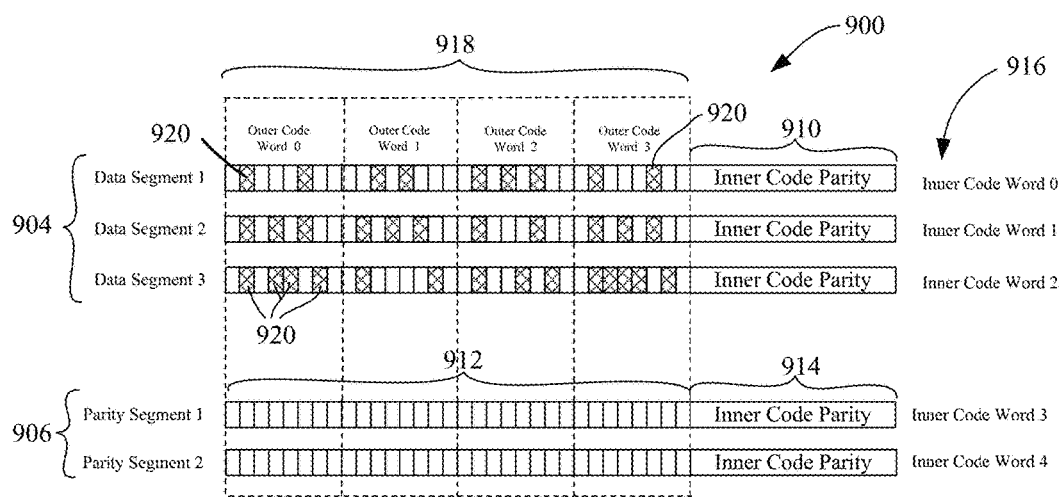
FIG. 9 illustrates a diagrammatic view of a data unit and its organized groupings of data into inner and outer codes based on a Reed-Solomon scheme, in accordance with certain embodiments of the present disclosure.

FIG. 8 illustrates a method 800 of recovering data on a storage medium under one embodiment. More specifically, method 800 recovers data on a storage medium by iterating between using the inner code and the outer code to correct errors (e.g. iterative outer code (IOC) recovery). With reference to FIG. 9, which illustrates a diagrammatic view of some embodiments of a data unit 900 and the organization of groups of data into inner code 910 and 914 and outer code 912 based on a RS scheme, each outer code word 918 can correct eight symbols of error. More specifically, each outer code word 918 may include eight symbols (e.g., m=8) per segment 904 and 906. With two r segments (e.g., r=2) and each outer code word including eight symbols per parity segment 906, sixteen symbols of parity in each outer code word 918 can correct eight symbol errors (which may not be correctable by the inner code) without erasure. Although no symbol errors may exist in segments 906, for purposes of simplification, it should be realized that parity segments 906 can include symbol errors which may also have to be corrected in order to utilize outer code 912.

Given the correction capability discussed above, exemplary data unit 900 may not recover all of the symbol errors using the inner code on its own or by using the outer code on its own. For example, the amount of symbol errors in each inner code word 916 may exceed the correction capability or correction reliability of inner code 910 and inner code recovery may be unable to recover these inner code words. Furthermore, outer code word 0 may include nine symbol errors 920 and outer code word 3 may include ten symbol errors 920. Therefore, the amount of symbol errors in these outer code words 918 may exceed the correction capability of outer code 912 and may be unable to recover these outer code words. However, the symbol errors in the exemplary embodiment illustrated in FIG. 9 may be corrected by iterating between using inner code 910 and outer code 912.

With reference back to block 802 of FIG. 8, an inner code word 916 may be selected. At block 804, it may be determined whether the inner code can correct the select inner code word. In FIG. 9, the inner code may fail to correct the symbol errors 920 in each of inner code words 0, 1 and 2. Therefore, when each of these three inner code words 916 are selected, the method may pass to block 806 to determine if more inner code words 916 need to be selected for analysis. If all inner code words 916 have been selected for analysis, then the method may pass to block 808. If, however, not all inner code words 916 have been selected for analysis, then the method may pass back to block 802. In the example embodiment of FIG. 9, such may be the case because inner code words 3 and 4 have yet to be analyzed. In FIG. 9, the inner code can correct errors in inner code words 3 and 4. Therefore, when each of these two inner codes words 916 is selected, the method may pass to block 810. At block 810, the inner code 910 or 914 (914 in the case of inner code words 3 and 4) may correct any errors in the select inner code word. While neither inner code word 3 nor 4 include symbol errors, if there were errors correctable by the inner code 914, these errors may be corrected at block 810.

At block 812, the method 800 may determine if more inner code words 916 remain to be selected for analysis. If all inner code words have been selected for analysis, then the method 800 may pass to block 814. If inner code words remain to be selected for analysis, the method may pass back to block 802. At block 814, it may be determined whether there are any uncorrected inner code words 916 from block 804. If so, method 800 may pass to block 808. If not, the method may end. As illustrated in FIG. 8, the above discussion in regards to blocks 802, 804, 806, 810, 812 and 814 may complete a first iteration 801 of the use of inner code to correct symbol errors in a data unit.

In conjunction with the example embodiment illustration in FIG. 9, inner code words 0, 1 and 2 may remain uncorrected. Therefore, method 800 may pass to block 808 where an outer code word 918 may be selected. At block 816, it may be determined whether the outer code can correct the select outer code word. In FIG. 9, the symbol errors 920 in each of outer code words 0 and 3 may exceed the correction capability of outer code 912 (e.g., each of outer code words 0 and 3 include more than eight symbol errors). Therefore, when each of these two outer code words 918 are selected, the method may pass to block 818 to determine if more outer code words 918 need to be selected for analysis. If all outer code words 918 have been selected for analysis, then the method may pass back to block 802. If, however, not all outer code words 918 have been selected for analysis, then the method may pass back to block 808. In the example embodiment of FIG. 9, such may be the case because outer code words 1 and 2 have yet to be analyzed. In FIG. 9, the amount of symbol errors in outer code words 1 and 2 may not exceed the correction capability of the outer code. In particular and as previously discussed, outer code words 1 and 2 may include 7 and 8 symbol errors. Therefore, when each of these two outer codes words 918 are selected for analysis, the method may pass to block 820. At block 820, the outer code 912 can correct the symbol errors in outer code words 1 and 2.

At block 822, the method 800 determines if more outer code words 918 may remain to be selected for analysis. If all outer code words have been selected for analysis, then the method 800 may pass to block 824. If outer code words remain for analysis, the method may pass back to block 808 which may select those outer code words for analysis. At block 824, it may be determined whether there were any uncorrected outer code words 918 as determined from block 816. If so, method 800 may pass back to block 802 which may perform a second iteration 805 of error correction using the inner code. If not, the method may end. An indication that all outer code words 918 are corrected may also be an indication that all inner code words 916 are corrected. As illustrated in FIG. 8, the above discussion in regards to blocks 808, 816, 818, 820, 822 and 824 complete a first iteration 803 of the use of outer code to correct symbol errors in a data unit.

Figure 10:
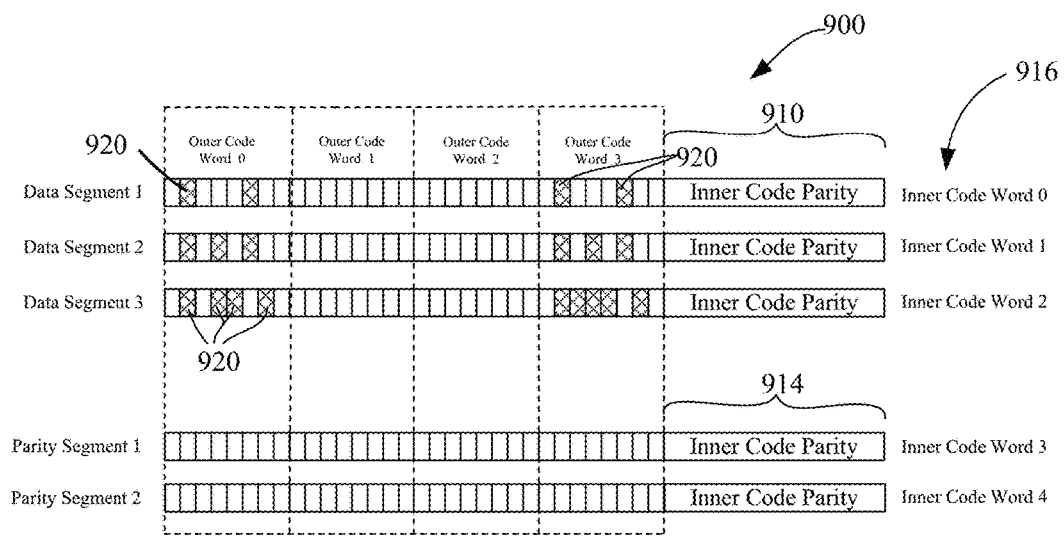
FIG. 10 illustrates a diagrammatic view of the data unit illustrated in FIG. 9 after data is recovered using a first iteration of inner code and a first iteration of outer code, in accordance with certain embodiments of the present disclosure.

FIG. 10 illustrates a diagrammatic view of data unit 900 and the organization of groups of data after performing the first iteration 801 of inner code and the first iteration of 803 on the data unit. In FIG. 10, outer code words 1 and 2 may be corrected, which may leave outer codes 0 and 3 uncorrected.

With more outer code word symbol errors to correct, method 800 may be passed back to block 802 to begin performing a second iteration 805 of inner code. At block 802, an inner code word 916 may be selected. At block 804, it is determined whether the inner code can correct the select inner code word. In FIG. 10, only the symbol errors 920 may not be corrected by inner code 910. Therefore, when inner code words 2 is selected, the method may pass to block 806 to determine if more inner code words 916 remain to be selected for analysis. If all inner code words 916 have been selected for analysis, then the method may pass to block 808. If, however, not all inner code words 916 have been selected for analysis, then the method may pass back to block 802. In the example embodiment illustrated in FIG. 10, such may be the case because inner code words 0, 1, 3 and 4 may yet to be analyzed. In FIG. 10, the symbol errors in inner code words 0, 1, 3 and 4 may be corrected by the inner code. Therefore, when each of these four inner codes words 916 may be selected, the method may pass to block 810. At block 810, the inner code 910 or 914 (910 in the case of inner code words 0 and 1 and 914 in the case of inner code words 3 and 4) may correct errors in the select inner code word. While neither inner code word 3 nor 4 may include symbol errors, if there were errors correctable by the inner code 914, these errors may be corrected at block 810.

At block 812, the method 800 may determine if more inner code words 916 remain to be selected for analysis. If all inner code words have been selected for analysis, then the method 800 may pass to block 814. If not all inner code words have been selected for analysis, the method may pass back to block 802. At block 814, it may be determined whether there are any uncorrected inner code words 916 from block 804. If so, method 800 may pass to block 808. If not, the method may end.

Figure 11:
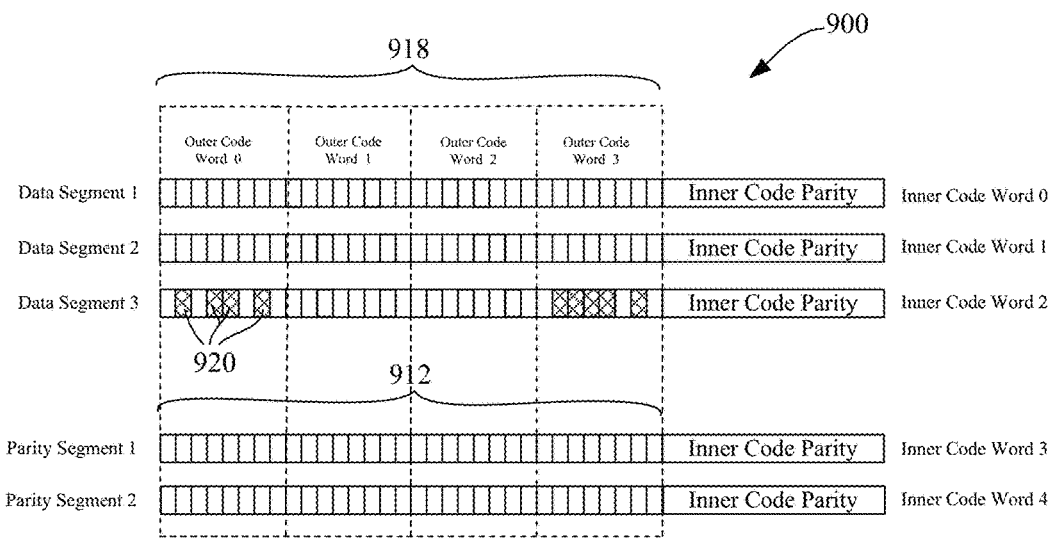
FIG. 11 illustrates a diagrammatic view of the data unit illustrated in FIG. 9 after data is recovered using a second iteration of inner code, in accordance with certain embodiments of the present disclosure.

In conjunction with the example illustration in FIG. 11, inner code word 2 may remain uncorrected. Therefore, method 800 may pass to block 808 to perform a second iteration 807 of the use of outer code to correct symbol errors in a data unit. At block 808, an outer code word 918 may be selected. At block 816, it may be determined whether the outer code may correct the select outer code word. In FIG. 11, if any of outer code words 918 exceed the correction capability of outer code 912 (e.g., each of outer code words 918 include more than eight symbol errors), then the method may pass to block 818 to determine if more outer code words 918 remain to be selected for analysis. If all outer code words 918 have been selected for analysis, then the method may pass back to block 802. If, however, not all outer code words 918 have been selected for analysis, then the method may pass back to block 808. In FIG. 11, the amount of symbol errors in outer code words 0, 1, 2 and 3 may not exceed the correction capability of the outer code. In particular, outer code word 0 includes four symbol errors, outer code word 1 includes no symbol errors, outer code word 2 includes no symbol errors and outer code word 3 includes only five symbol errors. Therefore, when these outer codes words 918 are selected for analysis, the method may pass to block 820. At block 820, the outer code 912 may correct the symbol errors in all outer code words.

Figure 12:
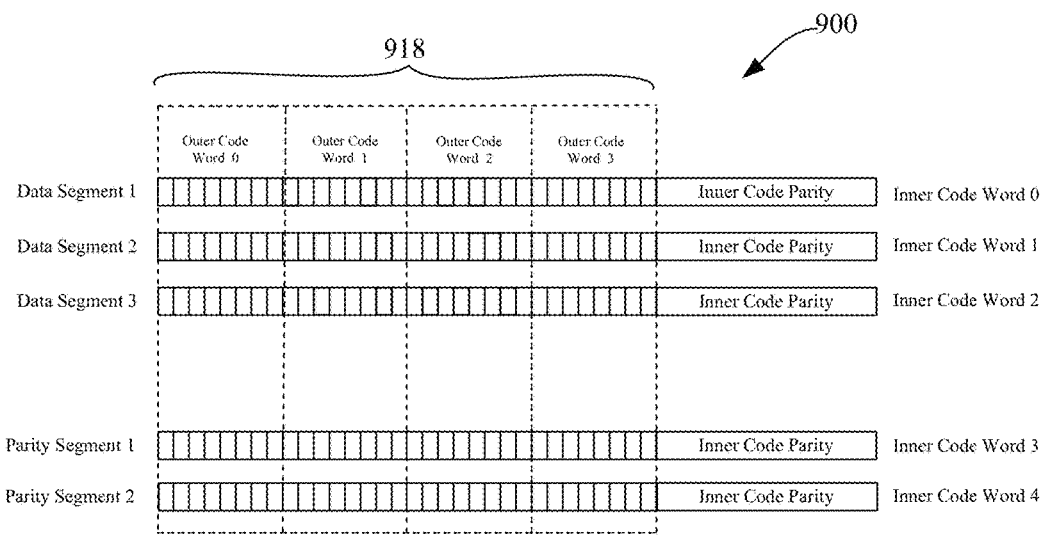
FIG. 12 illustrates a diagrammatic view of the data unit illustrated in FIG. 9 after data is recovered using a second iteration of outer code, in accordance with certain embodiments of the present disclosure.

At block 822, the method 800 may determine if more outer code words 918 need to be selected for analysis. If all outer code words have been selected for analysis, then the method 800 may pass to block 824. If not all outer code words have been selected for analysis, the method may pass back to block 808 to select those outer code words. At block 824, it may be determined whether there were any uncorrected outer code words 918 as determined from block 816. If so, method 800 may pass back to block 802 to perform a third iteration of error correction using the inner code. If not, the method may end. As illustrated in FIG. 12, the outer code words 918 of data unit 900 may have been corrected using first and second iterations of inner and outer code and therefore method 800 may end.

Figure 13:
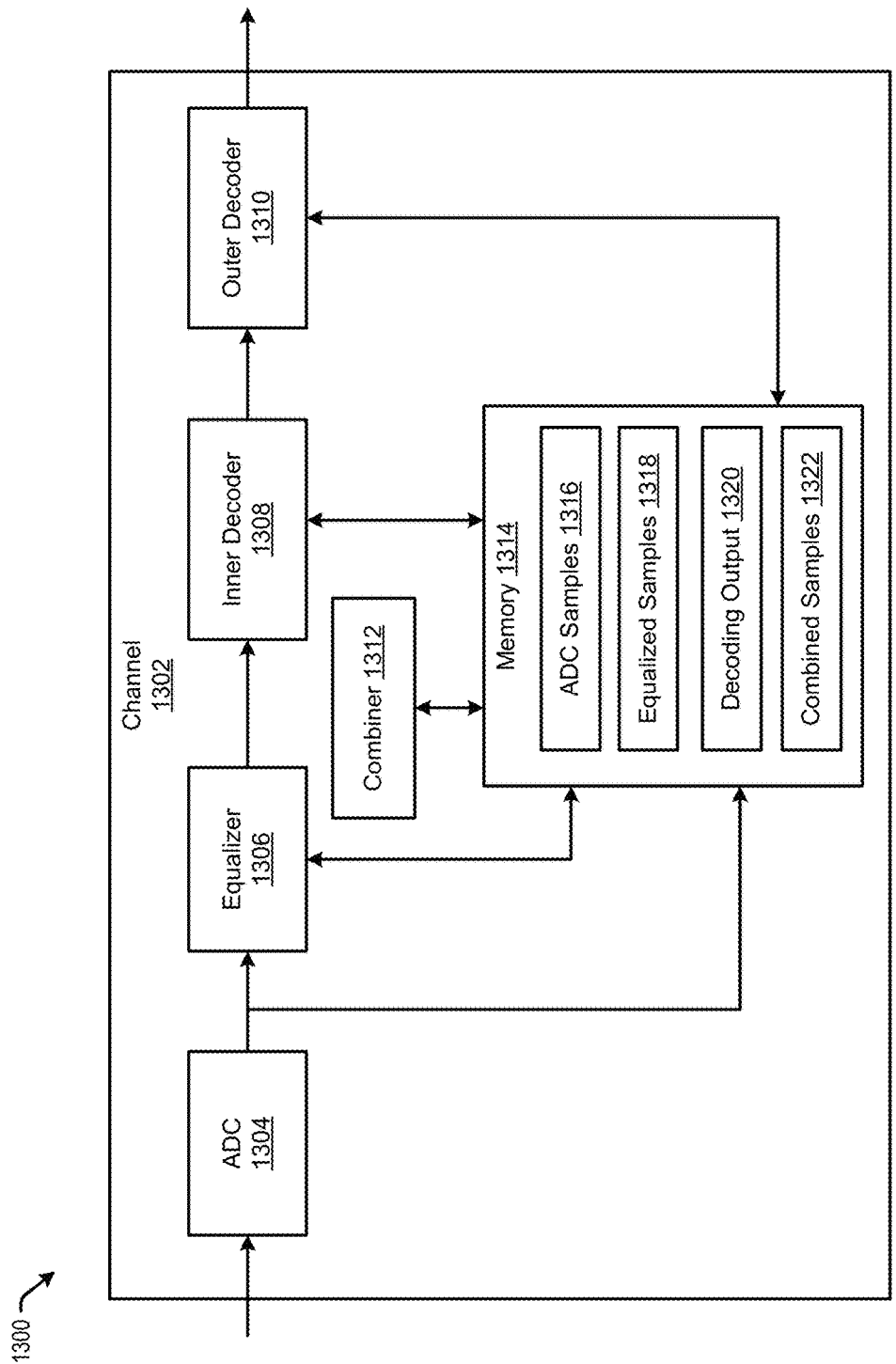
FIG. 13 is a simplified block diagram of an exemplary channel of a data storage device, in accordance with certain embodiments of the present disclosure.

In FIG. 13, an example block diagram of a system of data recovery is shown and generally designated 1300. In particular, the system 1300 may include a channel 1302. The channel 1302 may include an ADC (analog-to-digital converter) 1304, equalizer 1306, an inner decoder 1308, an outer decoder 1310, a combiner 1312, and a memory 1314. Examples of the general functions of the components of the channel 1302 are discussed below.

The ADC 1304 may receive a continuous time signal and generate ADC samples 1316. The ADC samples may be received by the equalizer 1306 and the memory 1314. The equalizer 1306 may generate equalized samples 1318 based on the ADC samples 1316. The equalized samples 1318 may be received by a detector and the inner decoder 1308 and the memory 1314. The detector and the inner decoder 1308 (e.g., an LDPC decoder) may generate a decoding output 1320, for example, hard decisions. The decoding output 1320 may be received by the outer decoder 1310 and the memory 1314. The outer decoder 1310 (e.g., a RS decoder) may generate further decoding output 1320 based on the decoding output 1320 from the inner decoder 1308 and/or the memory 1314. The combiner 1312 may perform one or more multi-read recovery functions to generate combined samples 1322. Examples of multi-read recovery functions may include X-averaging recovery, SERV-averaging recovery and/or ATIC recovery.

An example data flow for recovering segments during IOC recovery in the context of system 1300 of FIG. 13 follows. Equalized samples 1318 may be sent from the equalizer 1306 of the channel 1302 to the inner decoder 1308. The inner decoder 1308 may generate the decoding output 1320. The decoding output 1320 (e.g. hard data) may be sent to the outer decoder 1310 and also to the memory 1314. The outer decoder 1310 may use the decoding output 1320 and generate updated decoding output 1320 that may be returned to the memory 1314 and also may be returned to the inner decoder 1308. The process may continue iteratively until, for example, until the segments converge or until a number of iterations have been performed without convergence.

In addition, in some embodiments, IOC recovery may initially cause a selective read to be performed for failed data segments whose samples have not been retained during previous recovery steps. For example, in some examples with limited buffer storage for samples of failed data segments, the samples may be discarded after the buffer storage has reached capacity.

As stated above, some embodiments may combine IOC recovery with other error recovery schemes such as X-averaging, SERV, and ATIC. The following discussion sets forth example operations of X-averaging and SERV recovery and then discusses example embodiments combining IOC recovery with X-averaging or SERV. Discussions of example operations of ATIC recovery and of a system combining ATIC recovery with IOC are also provided.

Generally, X-averaging recovery may average multiple reads of ADC (analog-to-digital converter) samples for a segment. The averaged ADC samples may be used to generate equalized averaged samples (e.g. using a finite impulse response (FIR) filter of the combiner 1312). The equalized averaged samples may be used for inner code (e.g. LDPC) decoding by the inner decoder 1308.

In some examples of X-averaging, the averaged ADC samples may correspond to different read offset locations. The combiner 1312 may combine these averaged ADC samples via a MISO (multiple-input-single-output) equalization filter to generate composite averaged equalized samples that may be used by the inner decoder 1308. Thus, the X-averaging feature may benefit from averaging multiple reads and from averaging over multiple read offsets via MISO filtering to obtain improved equalized samples that may be used for decoding.

In some examples, X-averaging recovery may comprise three phases: (i) an acquisition phase, (ii) a replay phase, and (iii) a decode phase.

In an acquisition phase, the channel 1302 may initiate reads of one or more failed segments to acquire ADC samples multiple times for averaging. For example, the channel 1302 may stage selective reads (e.g. skip mask reads) of the one or more failed segments. The channel 1302 may initiate the first read of the failed segments at a certain read offset p0. In some examples, each failed segment's ADC sample information and hard data from the inner decoder 1308 may be stored in the memory 1314. As the averaged ADC samples may be acquired by reading the same segments multiple times (e.g. a pre-determined number n times), in some examples, the ADC samples may be divided by n and accumulated as the samples are stored in the memory 1314. In other examples, the ADC samples may be accumulated n times and then subsequently divided by n by the combiner 1312. The hard data contents may be overwritten during each read or the combiner 1312 may decide to choose hard decisions from a particular read attempt among these n reads for each segment or may choose to use hard decisions from a previous retry attempt prior to X-averaging.

The channel 1302 may repeat these operations at one or more different reader offset p1, p2, and so on for each failed segment. At the end of this process, the channel 1302 may exit the acquisition phase and move to the replay phase.

During the replay phase, the combiner 1312 may produce equalized samples for each failed segment, for example, using a MISO filter. In some examples, the channel 1302 may initiate the transfer of the averaged ADC samples for the read offsets p0, p1, and so on, respectively, to the MISO filter input along with hard decisions for each failed segment.

In some examples, the channel 1302 may also utilize least means square (LMS) adaptation in the MISO filter. At the end of each replay, the output of the combiner 1312 may be transferred to memory 1314 as combined samples 1322. The channel 1302 may perform m replays of the averaged ADC samples for a given failed segment to the MISO input to utilize LMS adaptation. At the end of the mth replay, the channel may stop the LMS adaptation and perform a final replay to acquire the final set of combined equalized samples for the failed segment. The combined samples may then be stored in the memory 1314 for use in the decoding phase. The channel 1302 may repeat the above replay phase (e.g. the LMS adaptation and combined sample generation) for each failed segment. The channel 1302 may then move to the decoding phase.

During the decoding phase, the channel 1302 may attempt to decode the failed segments using the combined samples 1322 from the replay phase for each failed segment. In some examples, the decoding phase may be the same as or similar to the operations of the inner decoder 1308 (e.g. LDPC decoding). Upon successfully decoding a failed segment, the channel 1302 may update the syndromes for the recovered segment. After the decoding phase has been completed for each failed segment, the channel 1302 may then exit X-averaging.

For failed segments that were recovered during the X-averaging decoding phase, the channel 1302 may discard the ADC and equalized samples for the recovered segments. For failed segments that were not recovered during the X-averaging decoding phase, the channel 1302 may preserve the combined samples 1322 so that IOC recovery may use the combined samples 1322.

As stated above, some embodiments may use SERV-averaging (e.g. in place of or in addition to X-averaging). In some examples, SERV-averaging of equalized samples may follow similar steps as outlined above for X-averaging with the following differences. In SERV averaging, the combiner 1312 may combine (e.g. average) multiple equalized samples in place of ADC samples and hard data. In addition, there may be no replay phase as the equalized samples may be averaged during the acquisition phase. The decoding phase of SERV averaging may be similar to that of X-averaging.

In view of the above descriptions of IOC recovery, X-averaging recovery and SERV-averaging recovery, an example embodiment that combines IOC recovery with one or more of X-averaging recovery and SERV-averaging recovery follows.

If IOC is invoked at a recovery step after X-averaging or SERV averaging have been performed, the channel 1302 may modify the IOC recovery operation to use the X-averaged or SERV-averaged combined samples 1322 instead of samples acquired during a read phase of IOC recovery. Some examples may utilize X-averaged or SERV averaged samples in the IOC process whenever available as this may increase the effectiveness of the IOC recovery process.

If IOC is invoked at a recovery step before X-averaging or SERV averaging have been performed, the channel 1302 may invoke one or both of X-averaging or SERV averaging to generate combined samples 1322 to be used in the IOC recovery process.

Figure 14:
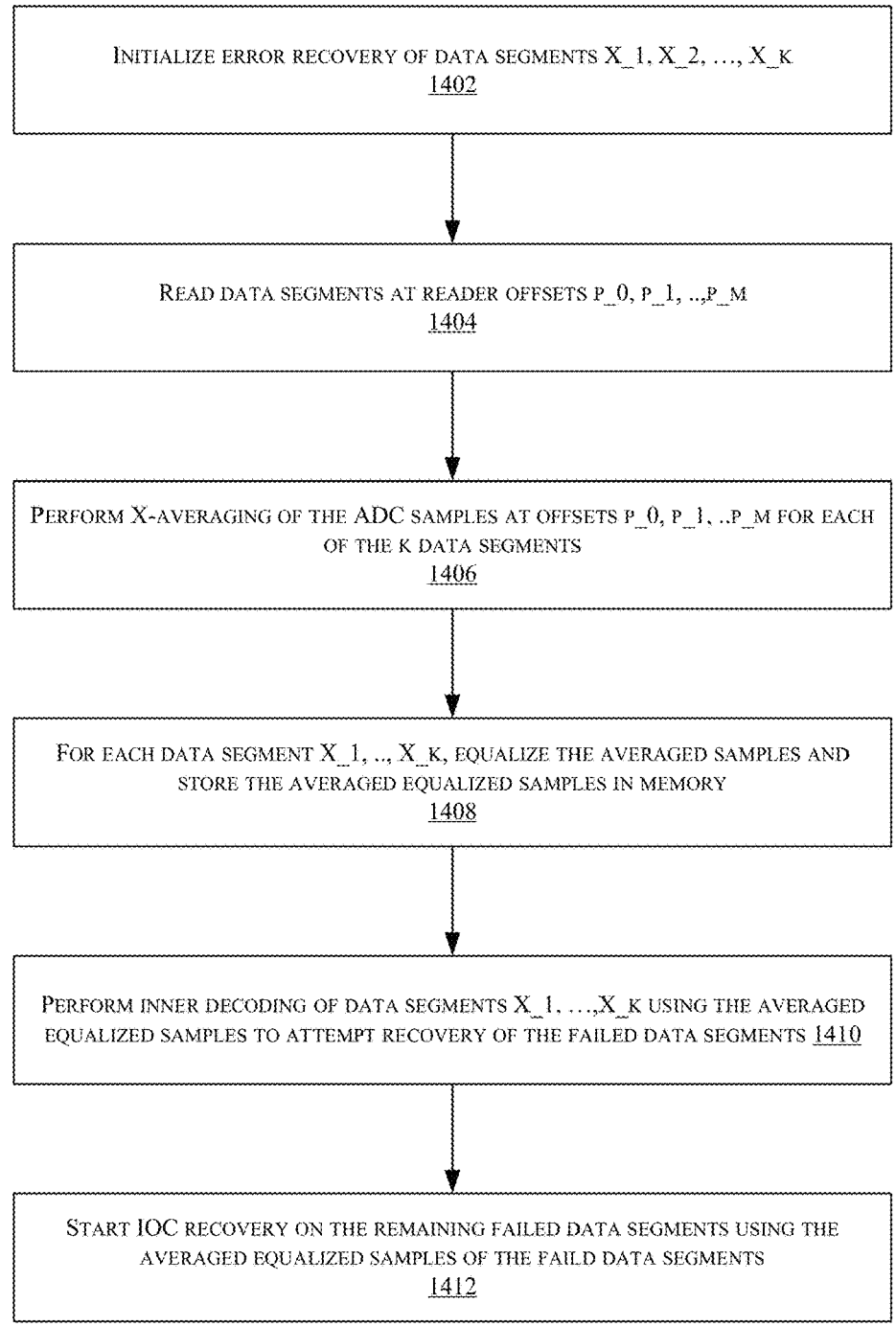
FIG. 14 is a flowchart illustrating a method of recovering data by utilizing inner-outer code (IOQ) recovery in combination with X-averaging, in accordance with certain embodiments of the present disclosure.

FIG. 14 illustrates a method 1400 of recovering data on a storage medium under one embodiment. More specifically, method 1400 may recover data on a storage medium by utilizing X-averaging in combination with iterative outer code (IOC) recovery.

At 1402, error recovery may be initialized for failed data segments, $X\_1, X\_2, \ldots, X\_k$. At 1404, the failed data segments may be sampled at reader offsets $p\_0, p\_1, \ldots, p\_m$. Next, at 1406, X-averaging may be performed for the ADC samples at offsets $p\_0, p\_1, \ldots p\_m$ for each of the k data segments.

At 1408, the averaged samples for various offsets may combined and equalized using a MISO filter to generate averaged equalized samples (e.g. combined samples 1322) for each data segment $X\_1, \ldots, X\_k$. The averaged equalized samples may then be transferred to memory (e.g. memory 1314). At 1410, inner decoding (e.g. inner code recovery) of failed data segments $X\_1, \ldots, X\_k$ may be performed using the averaged equalized samples to attempt to recover the failed data segments. At 1412, the IOC-recovery may be performed on the remaining failed data segments. During IOC recovery, the averaged equalized samples determined by X-averaging may be utilized for the failed data segments.

Figure 15:
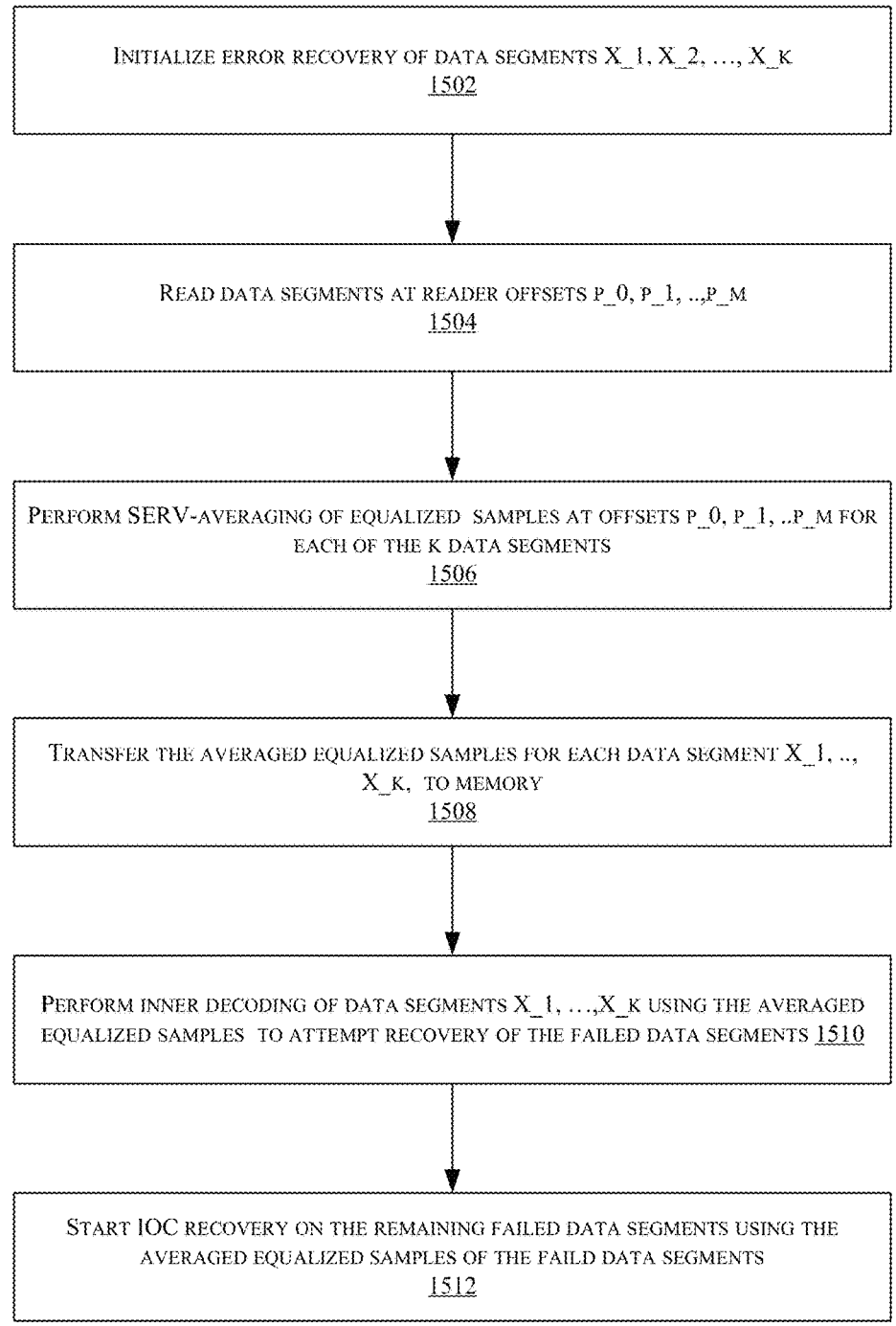
FIG. 15 is a flowchart illustrating a method of recovering data by utilizing IOC recovery in combination with X-averaging, in accordance with certain embodiments of the present disclosure.

FIG. 15 illustrates a method 1500 of recovering data on a storage medium under one embodiment. More specifically, method 1500 may recover data on a storage medium by utilizing SERV-averaging in combination with iterative outer code (IOC) recovery.

At 1502, error recovery may be initialized for failed data segments, $X\_1, X\_2, \ldots, X\_k$. At 1504, the failed data segments may be sampled at reader offsets $p\_0, p\_1, \ldots, p\_m$. Next, at 1506, SERV-averaging may be performed using multiple equalized samples at offsets $p\_0, p\_1, \ldots p\_m$ for each of the k data segments.

At 1508, the averaged equalized samples for each data segment $X\_1, \ldots, X\_k$, may be transferred to memory. At 1510, inner decoding (e.g. inner code recovery) of failed data segments $X\_1, \ldots, X\_k$ may be performed using the averaged equalized samples to attempt to recover the failed data segments. Then, at 1512, IOC recovery may be performed on the remaining failed data segments. During IOC recovery, the averaged equalized samples determined by SERV-averaging may be utilized for the failed data segment.

Figure 16:
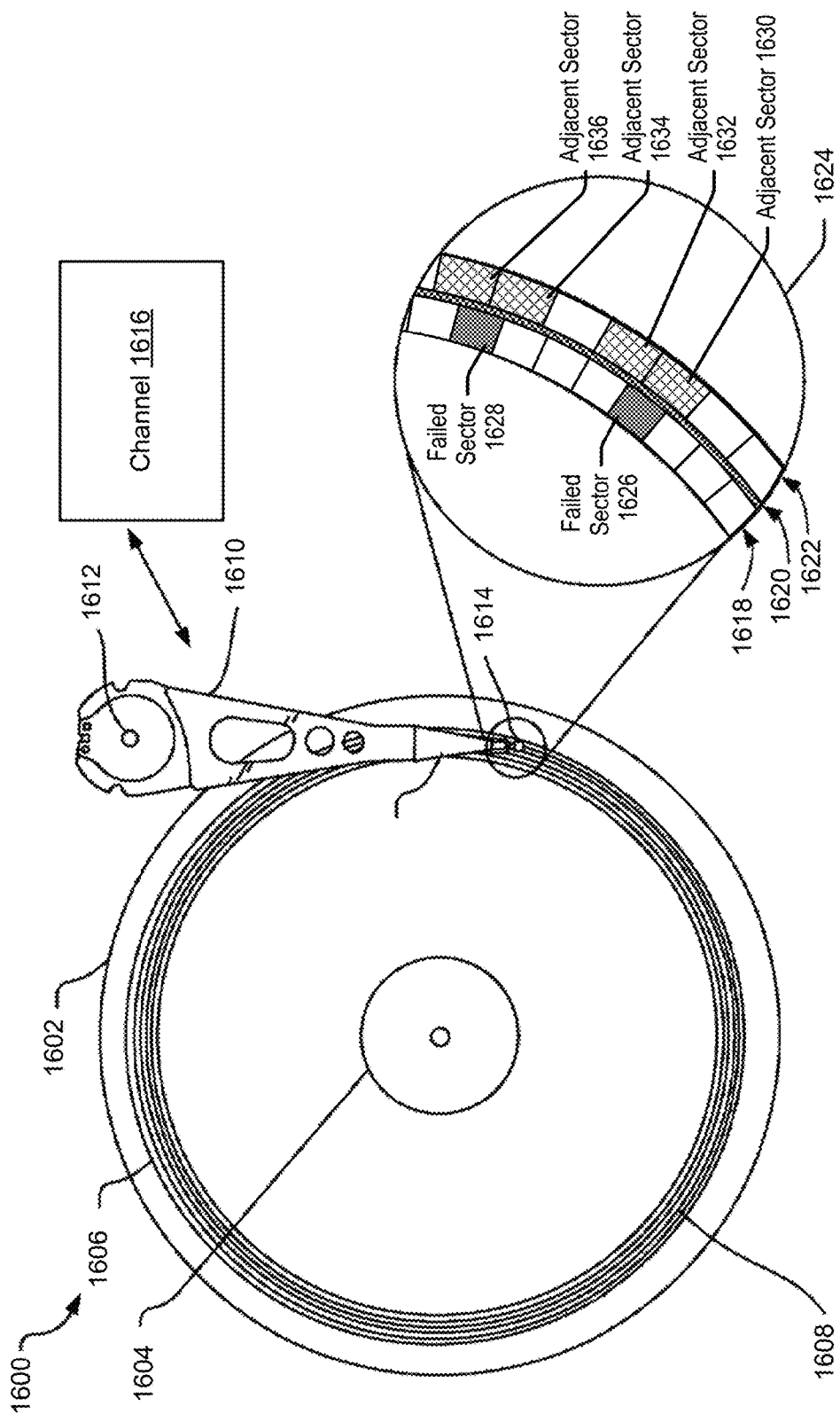
FIG. 16 is a simplified block diagram of an exemplary data storage device including adjacent track interference cancellation, in accordance with certain embodiments of the present disclosure.

Referring to FIG. 16, a block diagram of a system of adjacent track interference cancellation (ATIC) in the context of a hard disc drive is shown and generally designated 1600. A disc 1602 includes an inner diameter 1604 and an outer diameter 1606 between which are a number of concentric data tracks 1608, illustrated by circular dashed lines.

Information may be written to and read from the data tracks 1608 on the disc 1602. A transducer head 1614 may be mounted on an actuator assembly 1610 at an end distal to an actuator axis of rotation 1612. The transducer head 1614 may fly in above the surface of the disc 1602 during disc operation. The actuator assembly 1610 may rotate during a seek operation about the actuator axis of rotation 1612 positioned adjacent to the disc 1602. The seek operation may position the transducer head 1614 over a target data track of the data tracks 1614.

The exploded view 1624 illustrates two overlapping tracks, a first track 1618 and a second track 1622. The region 1620 shows an area where the two tracks may be overlapped in some examples.

Channel 1616 can include circuits and other elements that can be utilized to cancel interference from adjacent tracks.

Channel 1616 may include similar functionality to that discussed above with regard to channel 1302.

As shown, failed sectors 1626 and 1628 in the first track 1618 are adjacent to the adjacent sectors 1630-1636 in the second track 1622. In ATIC recovery, interference from the adjacent sectors 1630-1636 may be determined and cancelled from the failed sectors 1626 and 1628. This process is described in more detail below.

ATIC recovery may be initiated during error recovery to recover the failed data segments that remain at that stage in the error recovery process. In some examples, the channel 1616 may determine the data segment indices in the adjacent track (e.g. data unit) that are adjacent to the set of failed data segments of the data unit of interest. Referring to FIG. 16, the channel 1616 may determine the data segment indices of the adjacent sectors 1630-1636 as the sectors adjacent to failed sectors 1626 and 1628. The channel 1616 may also determine the overlap among the adjacent sectors 1630 and 1632 with respect to the failed sector 1626 and the overlap among the adjacent sectors 1634 and 1636 with respect to failed sector 1628.

The channel 1616 may then save data for the current track and prepare to collect data for a skipped mask read of the adjacent sectors 1630-1636 of the adjacent track 1622. For example, the channel 1616 may allocate storage for decoded data for the adjacent sectors from the adjacent track. The channel 1616 may also disable an OC syndrome update function before the adjacent sectors are read. The read of the adjacent sectors 1630-1636 may obtain both data and parity information. In some examples, the read of the adjacent sectors may be configured as a non-halting read operation to attempt to read the adjacent sectors in a same disk revolution. Data for the recovered sectors of the adjacent track may then be stored in the allocated storage. Once the skipped mask read is complete, the channel 1616 may generate adjacent decoding output data based on the portions of the adjacent sectors 1630-1636 that overlap the failed sectors 1626 and 1628. For example, the later portion of the decoded data from sector 1630 and the initial portion of sector 1632 may be chosen based on the overlapping boundary information and may be used to form the final set of decoding output data needed for cancelling the adjacent track signal contribution from the samples in sector 1626. A similar determination may be performed for sector 1628 with regard to adjacent sectors 1634-1636. This process may be repeated for each failed sectors in the track of interest or may be performed selectively based on, for example, the recovery success of the sectors in the adjacent track.

The channel 1616 may then restore the data for the current track and may enable the OC syndrome update function. The channel 1616 may then apply the adjacent track cancellation data to the failed sector samples and decode the updated samples of the failed sectors. IOC recovery may then be performed based on the improved samples of the failed sectors that were not recovered.

Figure 17:
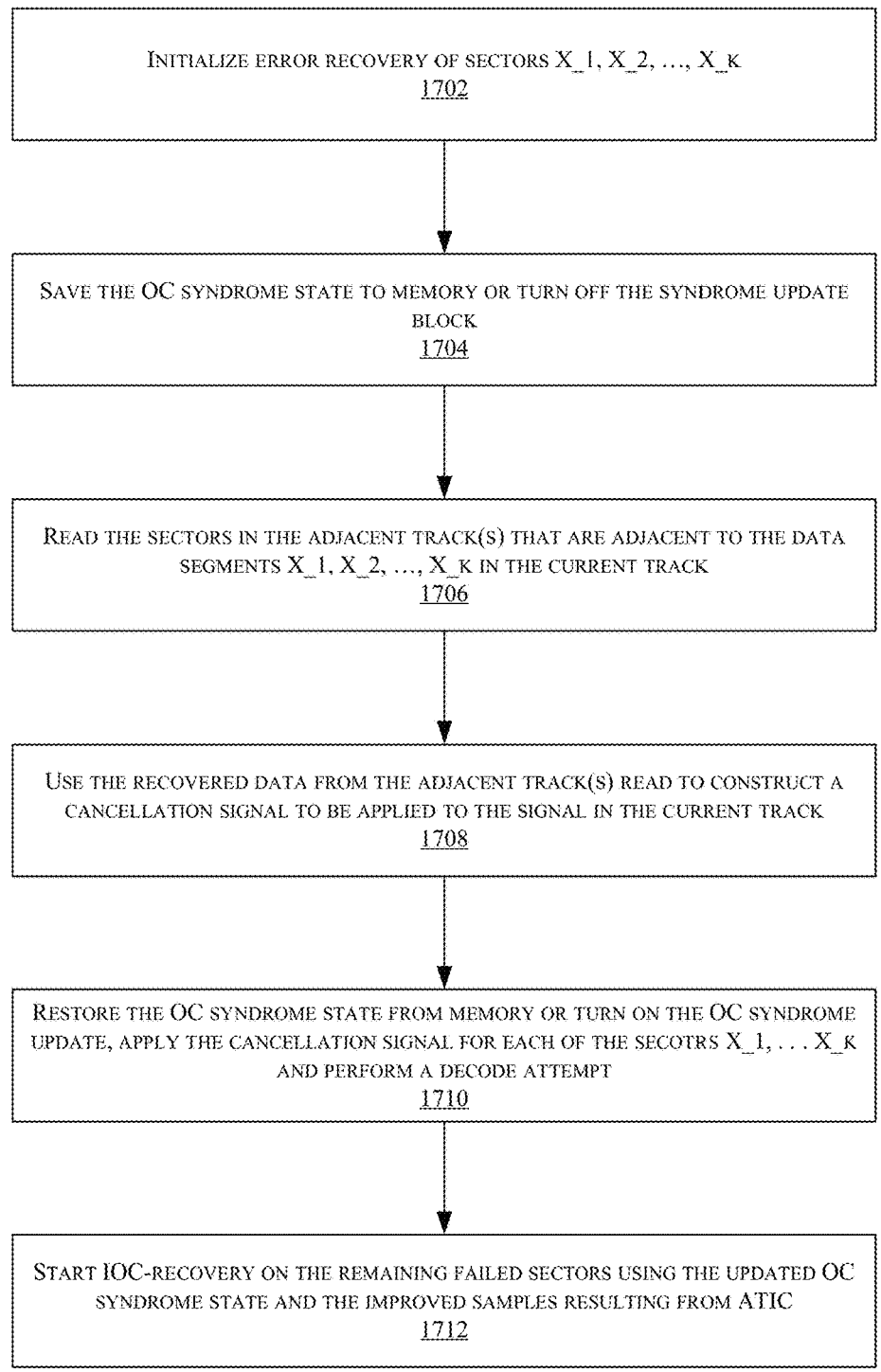
FIG. 17 is a flowchart illustrating a method of recovering data by utilizing IOC recovery in combination with adjacent track interference cancellation, in accordance with certain embodiments of the present disclosure.

FIG. 17 illustrates a method 1700 of recovering data on a storage medium under one embodiment. More specifically, method 1700 may recover data on a storage medium by utilizing ATIC in combination with iterative outer code (IOC) recovery.

At 1702, error recovery of a set of failed sectors, $X\_1, X\_2, \ldots, X\_k$ may be initialized. At 1704, the OC syndrome state may be stored in memory and/or the syndrome update function may be disabled. At 1706, the adjacent sectors in the adjacent track(s) to the failed sectors $X\_1, X\_2, \ldots, X\_k$ may be read. Next, at 1708, the adjacent track data from the adjacent track read may be utilized to construct a cancellation signal to be applied to the signal of the current track.

At 1710, the OC syndrome state may be restored from memory or the OC syndrome update function may be enabled. The cancellation signal for each of the sectors $X\_1, \ldots X\_k$ may be applied to the samples of the failed sectors. A decode attempt may then be performed and the OC syndrome may be updated based on any failed sectors that are recovered. At 1712, IOC recovery may be initialized on any remaining failed sectors using the updated OC syndrome state and the improved samples resulting from ATIC.

Many variations would be apparent in view of this disclosure. For example, though the above described embodiments illustrate a channel performing the described operations, other embodiments may include other components performing some or all of the operations. In a particular example, a formatter may perform some or all of the error recovery functionality described above. Components and circuits used to perform the operations in the method may be discrete, integrated into a system on chip (SOC), or other circuits. Further, the steps can be carried out in a processor (e.g. a digital signal processor), implemented in software, implemented via firmware, or by other means.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, the figures and above description provide examples of architecture and voltages that may be varied, such as for design requirements of a system. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a circuit configured to:
   initialize a read operation to read one or more requested data segments of a respective data unit;
   generate equalized combined samples for a failed data segment of the one or more requested data segments based on first samples and second samples; and
   perform iterative outer code recovery for the data unit utilizing the equalized combined samples as samples for the failed data segment.

2. The apparatus of claim 1, further comprising the circuit further configured to perform iterative outer code recovery at least in part by:
   performing a first iteration of inner code error correction on a plurality of symbol-based inner code words;

performing a first iteration of outer code error correction on a plurality of symbol-based outer code words, wherein each symbol included in one of the inner code words is also included in one of the outer code words and wherein at least one of the outer code words is correctable; and performing a second iteration of inner code error correction on the plurality of symbol-based inner code words, wherein at least one of the inner code words is correctable.

3. The apparatus of claim 1, further comprising the circuit further configured to perform the generation of the equalized combined samples for the failed data segment based on the first samples and the second samples by averaging at least the first samples and the second samples, the first samples being samples of a first sampling of the failed data segment and the second samples being samples of a second sampling of the failed data segment.

4. The apparatus of claim 3, further comprising the first samples being acquired by sampling the failed data segment at a first offset and the second samples being samples of the failed data segment acquired by sampling the failed data segment at a second offset.

5. The apparatus of claim 1, further comprising the circuit configured to generate the equalized combined samples for the failed data segment by:

generating the first samples by averaging first analog-to-digital converter (ADC) samples of the failed data segment and second ADC samples of the failed data segment, the first ADC samples and the second ADC samples sampled at a first offset;

generating the second samples by averaging third ADC samples of the failed data segment and fourth ADC samples of the failed data segment, the third ADC samples and the fourth ADC samples sampled at a second offset; and generating the equalized combined samples based on the first samples and the second samples using a multiple-input-single-output (MISO) filter.

6. The apparatus of claim 5, further comprising the circuit configured to:

generate other equalized combined samples for another failed data segment based on fifth samples and sixth samples by:

equalizing ADC samples to produce the fifth samples and the sixth samples; and averaging the fifth samples and the sixth samples to produce the other equalized combined samples; and the iterative outer code recovery further utilizing the other equalized combined samples as samples for the other failed data segment.

7. The apparatus of claim 1, further comprising the circuit further configured to:

generate the second samples by reading one or more adjacent segments adjacent to the failed data segment, the one or more adjacent segments being of an adjacent data unit that is adjacent to the respective data unit of the failed data segment;

determine a cancellation signal based on the second samples; and perform the generation of the equalized combined samples for the failed data segment based on the first samples and the second samples by applying the cancellation signal to the first samples.

8. The apparatus of claim 7, further comprising the circuit further configured to:

store an outer code syndrome state of the respective data unit prior to reading the adjacent data unit; and restore the outer code syndrome state after reading the adjacent data unit.

9. The apparatus of claim 7, further comprising the circuit further configured to:

disable an outer code syndrome state update function prior to reading the adjacent data unit; and enable the outer code syndrome state update function after reading the adjacent data unit.

10. An apparatus comprising:

a circuit configured to:

initialize a read operation to read one or more requested data segments of a respective data unit;

generate averaged samples for a failed data segment of the one or more requested data segments by averaging first samples of a first sampling of the failed data segment and second samples of a second sampling of the failed data segment; and perform iterative outer code recovery for the data unit based at least in part on the averaged samples.

11. The apparatus of claim 10, further comprising the first samples and the second samples being ADC samples; the circuit configured to:

generate other averaged samples by averaging third samples of a third sampling of the failed data segment and fourth samples of a fourth sampling of the failed data segment, the third samples and the fourth samples being ADC samples; and generate combined equalized samples based on the averaged samples and the other samples using a multiple-input-single-output (MISO) filter; and the circuit further configured to perform the iterative outer code recovery at least in part by utilizing the combined equalized samples as samples for the failed data segment.

12. The apparatus of claim 11, further comprising the first samples and the second samples being acquired by sampling the failed data segment at a first offset and the third samples and the fourth samples being samples of the failed data segment acquired by sampling the failed data segment at a second offset.

13. The apparatus of claim 11, further comprising the circuit further configured to:

generate other combined equalized samples for another failed data segment based on fifth samples and sixth samples by:

equalizing first ADC samples of a first sampling of the other failed data segment to produce the fifth samples;

equalizing second ADC samples of a second sampling of the other failed data segment to produce the sixth samples; and averaging the fifth samples and the sixth samples to produce the other equalized combined samples; and the iterative outer code recovery further utilizing the other equalized combined samples as samples for the other failed data segment.

14. The apparatus of claim 10, further comprising the first samples and the second samples being equalized samples.

15. The apparatus of claim 14, further comprising the first samples being acquired by sampling the failed data segment at a first offset and the second samples being samples of the failed data segment acquired by sampling the failed data segment at a second offset.

16. The apparatus of claim 10, further comprising the circuit further configured to perform iterative outer code recovery at least in part by:
- performing a first iteration of inner code error correction on a plurality of symbol-based inner code words;
- performing a first iteration of outer code error correction on a plurality of symbol-based outer code words, wherein each symbol included in one of the inner code words is also included in one of the outer code words and wherein at least one of the outer code words is correctable; and
- performing a second iteration of inner code error correction on the plurality of symbol-based inner code words, wherein at least one of the inner code words is correctable.

17. An apparatus comprising:
a circuit configured to:
- initialize a read operation to read one or more requested data segments of a respective data unit;
- generate first samples for a failed data segment of the one or more requested data segments;
- generate second samples by reading one or more adjacent segments that are adjacent to the failed data segment, the one or more adjacent segments being of an adjacent data unit that is adjacent to the respective data unit of the failed data segment;
- determine a cancellation signal based on the second samples; and
- generate equalized combined samples for the failed data segment based on the first samples and the second samples at least in part by applying the cancellation signal to the first samples; and
- perform iterative outer code recovery for the data unit based at least in part on the equalized combined samples.

18. The apparatus of claim 17, further comprising the circuit further configured to:
- store an outer code syndrome state of the respective data unit prior to reading the adjacent data unit; and
- restore the outer code syndrome state after reading the adjacent data unit.

19. The apparatus of claim 17, further comprising the circuit further configured to:
- disable an outer code syndrome state update function prior to reading the adjacent data unit; and
- enable the outer code syndrome state update function after reading the adjacent data unit.

20. The apparatus of claim 17, further comprising the circuit further configured to perform iterative outer code recovery at least in part by:
- performing a first iteration of inner code error correction on a plurality of symbol-based inner code words;
- performing a first iteration of outer code error correction on a plurality of symbol-based outer code words, wherein each symbol included in one of the inner code words is also included in one of the outer code words and wherein at least one of the outer code words is correctable; and
- performing a second iteration of inner code error correction on the plurality of symbol-based inner code words, wherein at least one of the inner code words is correctable.

* * * * *